United States Patent [19]
Nuckolls et al.

[11] Patent Number: 5,473,285
[45] Date of Patent: Dec. 5, 1995

[54] METHOD AND APPARATUS FOR PERFORMING PHASE ACQUISITION IN AN ALL DIGITAL PHASE LOCK LOOP

[75] Inventors: Charles E. Nuckolls; James R. Lundberg, both of Austin, Tex.

[73] Assignee: Motorola, Inc., Schaumburg, Ill.

[21] Appl. No.: 165,681

[22] Filed: Dec. 13, 1993

[51] Int. Cl.[6] .................................................. H03L 7/087
[52] U.S. Cl. .......................... 331/1 A; 327/156; 331/11; 331/17; 331/25
[58] Field of Search ................................ 331/1 A, 11, 17, 331/25; 328/155; 327/156

[56] References Cited

U.S. PATENT DOCUMENTS

| | | | |
|---|---|---|---|
| 4,577,163 | 3/1986 | Culp | 331/1 A |
| 4,795,985 | 1/1989 | Gailbreath, Jr. | 328/155 |
| 5,122,761 | 6/1992 | Wischermann | 331/1 A |

Primary Examiner—Siegfried H. Grimm
Attorney, Agent, or Firm—Charlotte B. Whitaker

[57] ABSTRACT

A method and apparatus for performing, after frequency acquisition, phase acquisition and phase maintenance in a digital phase-locked loop 10. A phase detector (12), determines the phase relation of an oscillator output to a reference clock signal, and provides a control signal to a controller (13), indicative thereof. When a subsequent logic state of the control signal provided by the phase detector is equal to an initial logic state of the control signal, the controller (13) increments or decrements a control value initially corresponding to a baseline frequency of the oscillator by the gain value, based upon the logic state of the control signal. When the control signal changes state, phase-lock has been acquired, and a gain value which determines the magnitude of change of the oscillator frequency is decreased. On every subsequent change in the logic state of the control signal, the gain value is decreased, unless at a minimum. If the control signal does not change for a predefined number of cycles, the gain value is increased.

23 Claims, 3 Drawing Sheets

FIG. 1

METHOD AND APPARATUS FOR PERFORMING PHASE ACQUISITION IN AN ALL DIGITAL PHASE LOCK LOOP

FIELD OF THE INVENTION

This invention relates generally to digital phase lock loops, and more particularly to a phase acquisition mechanism in a digital phase lock loop.

CROSS-REFERENCE TO RELATED APPLICATIONS

This application is related to the following applications:
1. "A METHOD AND APPARATUS FOR PERFORMING FREQUENCY DETECTION", Ser. No. 08/165,685, by Lundberg et al.
2. "A METHOD AND APPARATUS FOR DETERMINING A CONSTANT GAIN OF A VARIABLE OSCILLATOR", Ser. No. 08/165,687, by Lundberg et al.;
3. "A METHOD AND APPARATUS FOR PERFORMING FREQUENCY ACQUISITION IN AN ALL DIGITAL PHASE LOCK LOOP", Ser. No. 08/165,686, by Nuckolls et al.;
4. "A METHOD AND APPARATUS FOR PERFORMING FREQUENCY TRACKING IN AN ALL DIGITAL PHASE LOCK LOOP", Ser. No. 08/165,682, by Nuckolls et al.

All of which are filed simultaneously herewith and assigned to the assignee hereof.

BACKGROUND OF THE INVENTION

As portable computer applications proliferate, it has been desirable to incorporate power management techniques into microprocessors to reduce power and extend the battery life of the portable computer. One power management technique entails shutting down the microprocessor while statically maintaining code. This state is called low power stop (LPSTOP), where the microprocessor is completely quiescent, using no power. In portable applications, it is desirable to be able to force microprocessors in and out of this low power state (LPSTOP) very rapidly. Historically, the largest performance penalty in cycling in and out of LPSTOP has been the amount of time the phase-locked loop (PLL) requires to re-acquire phase lock. Thus, the frequency at which the microprocessor can use the low power state is dictated by how fast a PLL can acquire (re-acquire) phase-lock. Slow lock times reduce the frequency of entering/leaving LPSTOP and result in increased power dissipation. Fast lock times increase the frequency of entering LPSTOP and, therefore, reduce power.

In an analog PLL a voltage-controlled oscillator (VCO) is used to generate a periodic signal that is "locked" to a reference clock. This type of phase-locked loop combines frequency and phase lock into one mechanism. The frequency and phase of the VCO are modulated by an analog voltage adjusted via feedback mechanisms. The feedback mechanism is generally supplied from a sequential phase/frequency detector. The sequential phase/frequency detector outputs an "up" or "down" pulse proportional to phase error width and in the direction to pull in the frequency and phase of the VCO output signal to that frequency and phase of the target reference clock signal. When acquiring phase, frequency and phase constantly overshoot the target, but the magnitude of overshoot is slowly reduced until it is within acceptable limits. At this point the PLL is considered locked. For the above reasons, this type PLL suffers unnecessary time penalties on phase and frequency acquisition.

The gain of a VCO is defined as dF/dV (the change in VCO frequency per change in the analog control voltage). In a PLL, gain is a sensitive parameter; a high gain provides for faster phase acquisition but at the expense of stability. A low gain has very slow phase acquisition, but provides greater stability in normal clocking environments; however, a low gain VCO may not be able to track frequency drift or frequency modulation. One measure of a PLL's stability is measured by its ability to maintain minimal skew between the two signals it is phase-locking. Thus, it is desirable to have a PLL that provides for a very fast phase acquisition and improved long term stability.

SUMMARY OF THE INVENTION

The present invention provides a method and apparatus for performing phase acquisition and phase maintenance. This is accomplished in an all digital Phase-Locked Loop (PLL) with a variable digitally-controlled oscillator, a phase detector, a controller including an incrementor and decrementor coupled to the variable oscillator, and a set of oscillator control registers. An oscillator control value, corresponding to a target frequency of said digitally controlled variable oscillator, is stored in a first oscillator control register. An initial gain value is stored in a gain register. The phase detector, detects whether a rising edge of the oscillator output signal is behind or ahead of the rising edge of said reference clock signal, and provides a control signal, to said controller, indicative thereof, an initial logic state of said control signal is stored in a fourth control register.

When a subsequent logic state of the control signal provided by the phase detector is equal to the initial logic state of the control signal, the controller increments or decrements the control value by the gain value to generate an intermediate control value in response to the control signal indicating whether the oscillator output signal is behind or ahead of, respectively, the rising edge of the reference clock signal. The phase acquisition cycle is repeated until the logic state of the control signal provided by said phase detector is a complement of the initial logic state of the control signal. The controller indicates phase acquisition is complete by restoring the first control register to the control value corresponding to the target frequency.

DETAILED DESCRIPTION OF A PREFERRED EMBODIMENT

Figure 1:
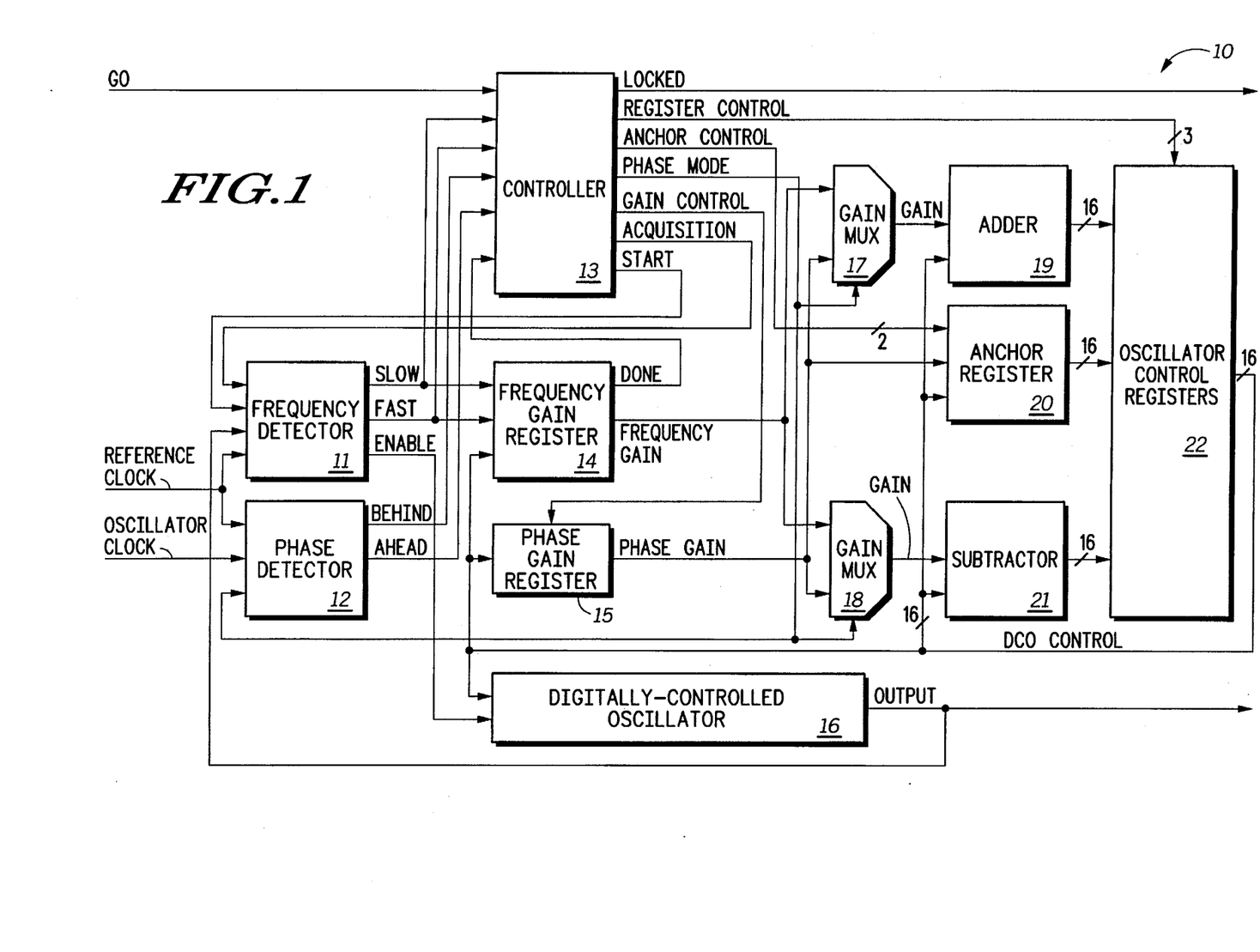
FIG. 1 illustrates in block diagram form an all digital phase-locked loop in accordance with a preferred embodiment of the present invention.

The present invention can be more fully described with reference to FIGS. 1 and 2. Illustrated in FIG. 1 is a block diagram of an all digital phase-locked loop (ADPLL) 10, in accordance with a preferred embodiment of the present invention. In a preferred embodiment, the ADPLL 10 has four modes of operation, frequency acquisition, phase acquisition, phase maintenance and frequency maintenance. The ADPLL 10 includes a frequency detector 11, a phase detector 12, a controller 13, frequency and phase gain registers 14 and 15, respectively, a digitally-controlled oscillator (DCO) 16, and gain multiplexors 17 and 18. The DCO 16 uses a sixteen bit binarily-weighted control signal (DCO CONTROL) to change the frequency and phase of the DCO output, as disclosed in a patent application entitled "Delay Element with Digitally Controllable Gain" Ser. No. 07/993,757, by Lundberg et al. filed on Dec. 21, 1992 and assigned to the assignee hereof. The binary value of these control signals determines the frequency of the DCO 16. The DCO 16 has a gain which is defined as dF/d(DCO CONTROL). Thus, the larger the change in the binary value held by the DCO CONTROL signals, the larger the change in the frequency of the DCO 16. Accordingly, the frequency of the DCO is changed via arithmetic increments or decrements to the 16 control bits. During frequency acquisition, the frequency detector 11 outputs a digital signal either "FAST" or "SLOW" every other reference clock boundary. The FAST or SLOW digital signal initiates an increment or decrement to the DCO control register 22. The magnitude of the increments or decrements to the DCO control register 22 (the frequency gain), is dictated by the frequency-gain register 14.

The ADPLL 10 starts in the frequency acquisition mode. In the frequency acquisition mode, the DCO control register 22 is initialized to a value of $4000 (where "$" refers to a hexadecimal value), in accordance with a preferred embodiment. Starting with a frequency gain of $2000, provided by the frequency gain register 14, and using a modified binary search algorithm, the DCO control register 22 is updated based on the output signal provided by the frequency detector 11. During frequency acquisition, the frequency detector 11 performs a digital frequency comparison between the reference clock signal and the output signal provided by the DCO 16, and outputs a FAST or SLOW signal every two reference clock cycles. In a preferred embodiment, the gain is reduced every time a change in search direction occurs (i.e. a shift in the frequency gain register 14 occurs). Accordingly, one shift in the frequency gain register 14 causes a reduction in frequency gain by a factor of four, but only for one of either the subtract gain value or the add gain value. On successive shifts, gain reduction alternates between the add gain value and the subtract gain value. On every change in search direction, the frequency gain is reduced by a factor of two, as illustrated in Table I below.

In accordance with a preferred embodiment of the present invention, there is a, one-to-one mapping of frequency gain weights to DCO CONTROL weights; for instance, an add gain value of $4000 would present an increment to the DCO CONTROL value of 100% if the DCO CONTROL value was $4000, as demonstrated in the first frequency detect cycle of Table I. When the frequency gain value stored in the frequency gain register 14 is less than the DCO CONTROL value stored in the DCO control register 22 bit-shifted right by ten bit positions, a frequency match has occurred between the reference clock signal and the output of the DCO 16 to an error of one in 210 or +/−0.1%. The ADPLL 10 then completes frequency acquisition by transferring the value in the DCO control register 22 to the anchor register 20, thereby storing the baseline frequency value in the anchor register 20.

TABLE I

| Frequency Detector Output/Cycle | | Add Gain | Subtract Gain | DCO CONTROL |
|---|---|---|---|---|
| Initial | | $4000 | $2000 | $4000 |
| Cycle 1. | SLOW | | | |
| Result: | | $4000 | $2000 | $8000 |
| Cycle 2. | FAST | | | |
| Result: | | $1000 | $2000 | $6000 |
| Cycle 3. | SLOW | | | |
| Result: | | $1000 | $800 | $7000 |
| Cycle 4. | SLOW | | | |
| Result: | | $1000 | $800 | $8000 |
| Cycle 5. | FAST | | | |
| Result: | | $400 | $800 | $7800 |
| Cycle 6. | SLOW | | | |
| Result: | | $400 | $200 | $7C00 |
| Cycle 7. | FAST | | | |
| Result: | | $100 | $200 | $7A00 |
| Cycle 8. | SLOW | | | |
| Result: | | $100 | $80 | $7B00 |
| Cycle 9. | SLOW | | | |
| Result: | | $100 | $80 | $7C00 |
| Cycle 10. | FAST | | | |
| Result: | | $40 | $80 | $7B80 |

Phase acquisition aligns the buffered output (divided by two) of the DCO 16 to the reference clock signal. On the rising edge of every reference clock signal, the phase detector 12 outputs a digital signal "AHEAD" or "BEHIND". During phase acquisition, the DCO control register 22 is incremented or decremented (in one direction only) every reference clock cycle by the gain value stored in the phase gain register 15, until a change in the polarity of phase error is detected by the controller 13. The phase gain register 15 stores a bit-shifted value of the DCO CONTROL value (base frequency) currently stored in the DCO control register 22. Upon detecting the change in the polarity of the phase error, the ADPLL 10 completes phase lock by loading the value stored in the anchor register 20 into the DCO control register 22, thereby restoring the DCO control register 22 to the baseline frequency.

When phase acquisition is complete, phase-locking has been achieved, and the ADPLL 10 enters a phase/frequency maintenance mode of operation. During phase maintenance, the DCO control register 22 is incremented or decremented every cycle (based on the output of the phase detector 12) by the gain value stored in the phase gain register 15, unless a change in the polarity of the phase error is detected. If a change in the polarity of the phase error is detected, the value stored in the anchor register 20 is loaded into the DCO control register 22 to restore the baseline frequency. Also, when a change in phase-error polarity is detected, the shift displacement of the phase-gain register 15 is incremented (unless the shift displacement is at a maximum value), thereby reducing the phase gain by a factor of two. In a preferred embodiment, if a change in polarity is not detected for eight consecutive phase cycles, the phase gain shift displacement is decremented (unless the shift displacement is at a minimum value), thereby increasing the phase gain by a factor of two. This mechanism allows the phase gain to change as operating conditions warrant.

Frequency maintenance occurs simultaneously with phase maintenance. In accordance with the preferred embodiment, the anchor register 20 is updated during frequency maintenance, thereby changing the baseline frequency of operation of the DCO 16. After phase acquisition, if four consecutive increments of the DCO control register 22 occur, then the anchor register 20 is incremented once. Similarly, if four consecutive decrements of the DCO control register 22 occur, the anchor register 20 is decremented once. This mechanism allows the baseline frequency stored in the anchor register 20 to track as operating conditions change with time.

Figure 2:
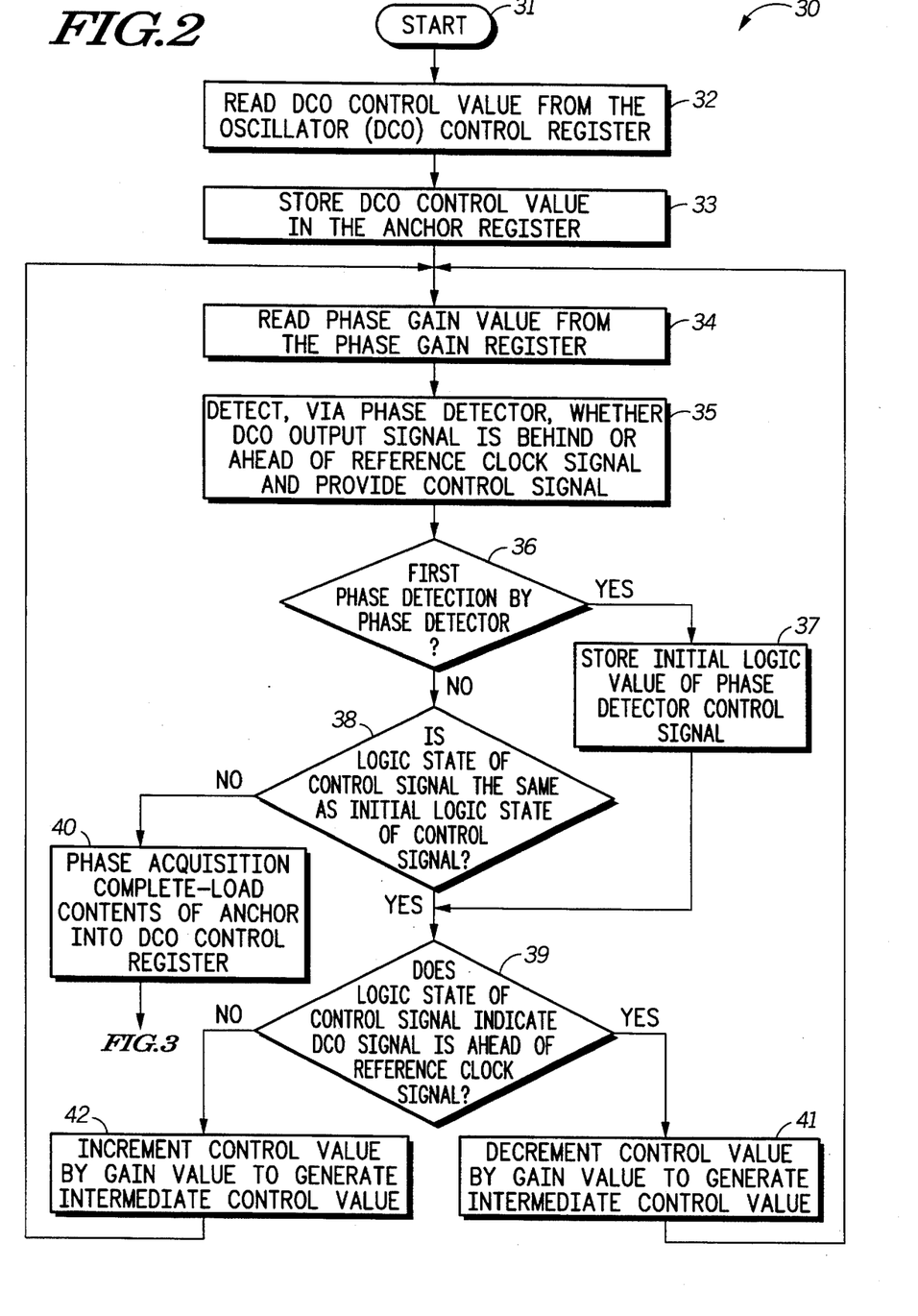
FIG. 2 illustrates in flow diagram form a method for performing phase acquisition in the all digital phase-locked loop of FIG. 1, in accordance with the present invention.

Illustrated in FIG. 2 is a flow diagram 30 for performing phase acquisition that may be used to implement the present invention. As illustrated in FIG. 2, at the beginning of phase acquisition, the DCO control register 22 contains a DCO CONTROL value that corresponds to the frequency of the DCO 16, as indicated at step 32. Accordingly, the speed of operation of the DCO 16 is a function of the control value maintained in the DCO control register 22. At step 33, the initial DCO CONTROL value corresponding to the baseline frequency is stored in the anchor register 20 so it may be retrieved once phase acquisition has been achieved. The phase gain value is read to determine a magnitude of change to the DCO control register 22 and a corresponding change in DCO 16 frequency, at step 34. The phase gain value is stored in the phase gain register 15.

At step 35, the phase detector 12 determines whether the OUTPUT signal provided by the DCO 16 is ahead of or behind the REFERENCE CLOCK signal, and provides a control signal (i.e. AHEAD or BEHIND), indicative thereof. In a preferred embodiment, the phase detector 12 includes two edge-triggered D-flip-flops (not shown), which implement a synchronizer, clocked by the REFERENCE CLOCK signal. The phase detector 12 latches the binary value of the OUTPUT signal, provided by DCO 16, on the rising edge of the reference clock signal, thereby determining whether the phase of the output signal is ahead of or behind the reference clock signal. If a logic "1" is latched, the OUTPUT signal is ahead of the reference clock signal, otherwise, the OUTPUT signal is behind. If the phase detector 12 indicates AHEAD, it is necessary to slow down the DCO 16 output signal frequency by decrementing the DCO control register 22. If BEHIND is indicated by the phase detector 12, it is necessary to speed up the DCO 16 output signal frequency by incrementing the DCO control register 22. At decision block 36, a query is made as to whether the current phase detect cycle is the first phase detect cycle. If so, the initial phase detect output signal (i.e., AHEAD or BEHIND) will be stored at step 37, to determine the direction of adjustments needed to bring the phase of OUTPUT signal coincident to the phase of the REFERENCE CLOCK signals (collectively referred to hereafter as "the two clock signals").

Accordingly, at step 37, the initial phase detect output (e.g. AHEAD) is stored in a register (not shown) in said controller 13 so comparisons can be made after subsequent phase-detect cycles to see if the polarity of phase error has changed. After each phase detect cycle, a comparison is performed by the controller 13 to determine whether the current logic state of the control signal is the same as the stored initial logic state of the control signal, as indicated by decision block 38. Thus, if a subsequent logic state of the control signal (e.g. AHEAD) provided by the phase detector 12 is identical to the initial logic state of the phase detector 12 control signal, then additional corrections are needed to bring the two clock signals into phase alignment. At decision block 39, if the logic state of the control signal provided by the phase detector 12 indicates "ahead", the DCO 16 output signal frequency needs to be slowed down. This is accomplished at step 40 by decrementing, via subtractor 21 the DCO CONTROL value by the phase gain value stored in the phase gain register 15, and loading the result (intermediate value) into the DCO control register 22. Conversely, if the logic state of the control signal indicates "behind", the DCO 16 output signal frequency is increased by incrementing, via the adder 19, the DCO CONTROL value by the phase gain value, at step 41, and loading the intermediate value into the DCO control register 22. The phase acquisition process continues until the controller 13 detects a change in polarity of phase (i.e. that current logic state of the control signal provided by the phase detector 12 is different from the stored initial logic state of the phase detector 12 control signal), and indicates phase acquisition is complete at step 40.

Upon completion of phase acquisition, the contents of the anchor register 20 are loaded into the DCO control register 22, thereby restoring the frequency of the output of DCO 16 to the baseline frequency. During phase acquisition, the problem of a 180 degree phase-detect error due to noise is precluded by dividing the OUTPUT signal of the DCO 16 by two. Thus, whenever a change in phase polarity is detected (even if erroneously induced by noise), the change must be on a true rising edge of the DCO 16 output. The worst-case speed at which phase can be acquired is, therefore, a function of the magnitude of the phase-gain value. In the preferred embodiment, the maximum amount of phase error is 90 degrees. This follows from the fact that the OUTPUT signal provided by the DCO 16 oscillates at four times the frequency of the REFERENCE CLOCK signal, but a divide-by-2 is done for phase acquisition. In the preferred embodiment, a shift displacement of eight from the DCO CONTROL value is used as the initial phase gain value, as described in a related application entitled "A METHOD AND APPARATUS FOR DETERMINING A CONSTANT GAIN OF A VARIABLE OSCILLATOR", Attorney Docket SC-02114A, by Lundberg et al. A phase gain value of this size represents a gain that will result in a change in the period of approximately 1/256th of the period of the DCO 16 for each correction. If the maximum phase error is 90 degrees, then the worst case requires an accumulation of approximately 64/256ths of the baseline period over all phase-acquisition corrections. The worst-case number of phase corrections can be approximated in the following manner:

$$\sum_{i=1}^{n} \frac{i}{256} = \frac{64}{256} \qquad \text{Eqn. 1.1}$$

$$\sum_{i=1}^{n} i = 64 \qquad \text{Eqn. 1.2}$$

$$\frac{n^2 + n}{2} = 64 \qquad \text{Eqn. 1.3}$$

$$n = 10.8$$

Therefore, for the worst-case phase error, approximately eleven phase-acquisition cycles are required.

Figure 3:
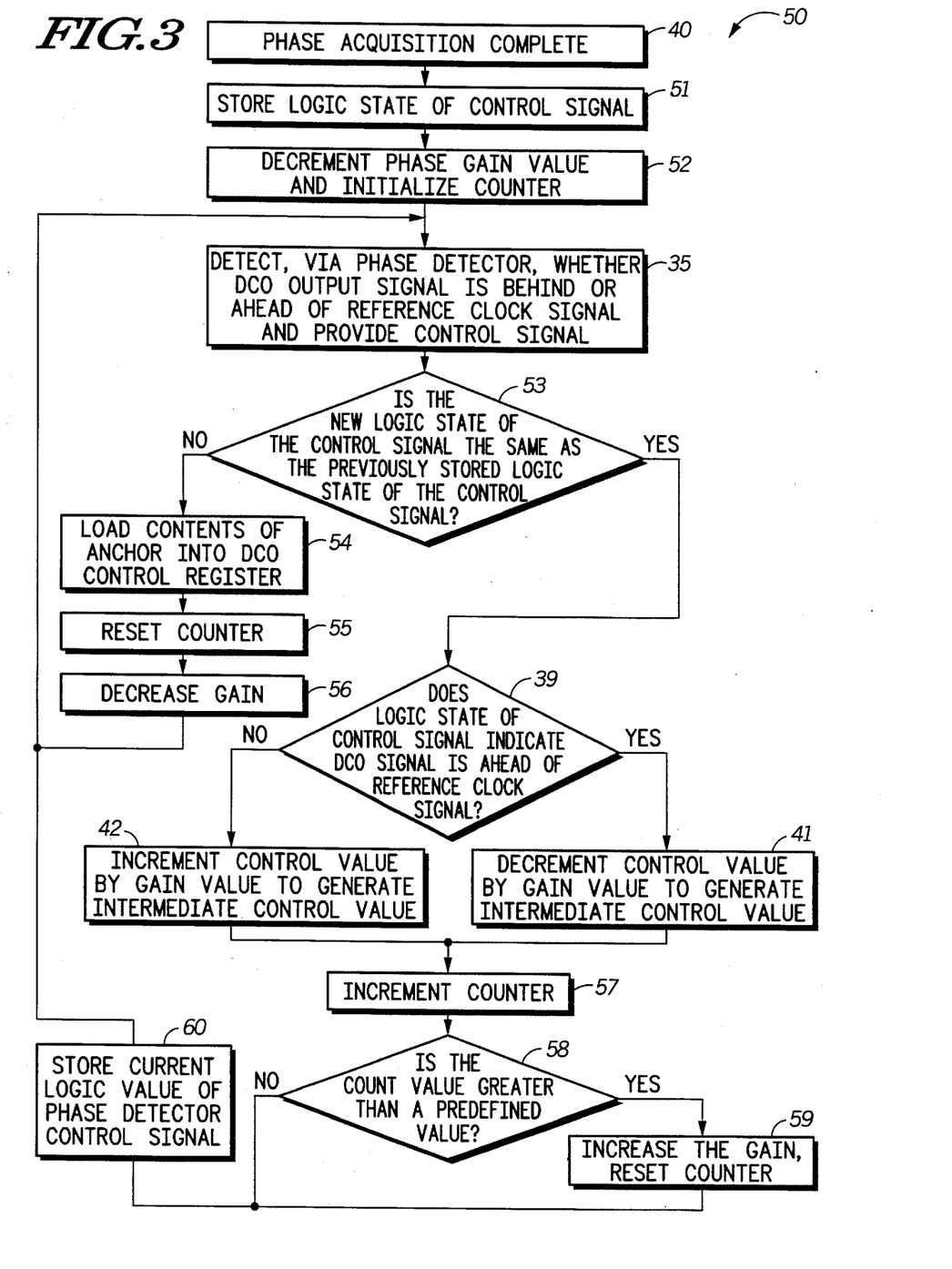
FIG. 3 illustrates in flow diagram form a method for performing phase maintenance in the all digital phase-locked loop of FIG. 1, in accordance with the present invention.

Illustrated in FIG. 3 is a flow diagram 50 for performing phase maintenance in the ADPLL 10 with a variable gain mechanism, in accordance with the present invention. In FIG. 3, analogous steps to those found in FIG. 2 are numbered identically. The final output control signal provided by the phase detector 12, during phase acquisition, is stored in a register in the controller 13, at step 51. At step 52, the phase gain value is decreased by incrementing the shift displacement, so subsequent changes to the DCO CONTROL value will have a smaller effect on the DCO 16 output signal frequency, thereby improving stability and reducing jitter of the ADPLL 10. A counter (not shown) in the controller 14, used to track the number of consecutive corrections in one direction, is initialized to zero.

At step 53, the controller 13 determines whether the logic state of the control signal currently provided by phase detector 12 is identical to the previously stored logic state of such control signal. If the current logic state of the control signal (e.g. AHEAD) is identical to that of the previously stored logic state of the control signal (e.g. AHEAD), then the controller 13 ascertains that additional corrections in the same direction are needed to bring the two clock signals into phase alignment. If the logic state of the currently provided control signal (e.g. BEHIND) differs from the previously stored phase detector logic state (e.g. AHEAD), then the controller 13 ascertains that phase alignment has been achieved again. When phase alignment has been achieved, the target frequency of the DCO 16 is restored by loading the DCO control register 22 with the contents of the anchor register 20, at step 54. The counter used to track the number of consecutive corrections made in the same direction is reset to zero, at step 55.

At step 56, the phase gain value, stored in the phase register 15, is decreased (as described above) so subsequent changes to the DCO CONTROL value will have a smaller effect on the DCO 16 output signal frequency. The counter used to track the number of consecutive corrections made in the same direction is incremented by one, at step 57. At step 58, a comparison is made between the current value of the counter and a predefined value. If the count equals the predefined value, then phase alignment has not occurred within that number of cycles, indicating that the size of corrections is not large enough. The phase gain value is, therefore, increased at step 59 by decrementing the shift displacement amount, so subsequent changes to the DCO CONTROL value will have a greater affect on the DCO 16 output signal frequency, and the counter is reset. This improves the PLL's ability to maintain phase alignment with minimal skew in the presence of noise, temperature or VDD drift, or phase/frequency modulation. At step 60, the output of the phase detector 12 is stored in a register in controller 13 so comparisons can be made after subsequent phase detect cycles to see if the polarity of phase error has changed.

Summarily, in a preferred embodiment, the phase gain register 15, anchor 20, DCO control register 22, adder 19 and subtractor 21 also function as a self-adjusting gain mechanism. The self-adjusting gain mechanism allows the ADPLL 10 to optimize the PLL gain, compensating for temperature, voltage and frequency variations, and thereby improving the overall stability of the ADPLL 10. The self-adjusting gain mechanism tracks the ADPLL 10 history and selects an appropriate gain value during phase maintenance. Furthermore, the self-adjusting gain mechanism in the ADPLL 10 will vary the size of corrections by factors of two through operation to provide the optimal gain. Thus, in the present invention, after acquiring the correct frequency in the DCO 16, phase alignment is accomplished by making adjustments to the DCO control register 22 using the largest correction allowed. Since phase is acquired by altering the oscillator (DCO 16) frequency, the oscillator inertia will cause skew to increase again after phase alignment has briefly occurred. Like a damping mechanism, as the ADPLL 10 approaches phase alignment the second time, the size of corrections is reduced by a factor of two and then reduced again by a factor of two for the third approach towards phase alignment, etc. In all, four gain sizes are utilized. The largest gain value affects the DCO control register 22 by an amount equal to approximately $\frac{1}{256}$th of its value; whereas, the smallest gain value affects the DCO control register 22 by an amount equal to approximately $\frac{1}{2048}$th of its value. The ADPLL 10 also has the ability to increase the gain value. If more than eight corrections are made without phase alignment, the size of the gain is doubled. Thus, reducing and increasing the gain are bounded by the four allowable gain sizes.

Accordingly, the present invention provides a mechanism for performing fast phase acquisition with improved phase maintenance to ensure long term stability of operation of an all digital phase lock loop 10. While the present invention has been described in accordance with a preferred embodiment, it should be apparent to one of ordinary skill in the art that the invention may be practiced in numerous ways. Accordingly, it is intended by the appended claims to cover all modifications of the invention which fall within the true spirit and scope of the invention.

We claim:

1. In a system having a digitally- controlled variable oscillator and a phase detector for comparing a rising edge of a reference clock signal to a rising edge of an oscillator output signal, and a controller including an incrementor and a decrementor coupled to said oscillator and a set of oscillator control registers, a method for performing phase acquisition comprising the steps of:

a) reading a control value stored in a first oscillator control register, said control value initially corresponding to a baseline frequency of operation of said digitally controlled variable oscillator, and storing said control value initially corresponding to said baseline frequency in an anchor register, said anchor register functioning to restore said digitally-controlled variable oscillator to said baseline frequency of operation by re-loading said control value into said first oscillator control register upon completion of phase acquisition;

b) detecting, via said phase detector, whether said rising edge of said oscillator output signal is behind or ahead of said rising edge of said reference clock signal, and providing a control signal to said controller, indicative thereof, an initial logic state of said control signal being stored in a second oscillator control register;

c) incrementing or decrementing, via said controller, said control value stored in said first oscillator control register by a gain value to generate an intermediate control value in response to said control signal indicating that said oscillator output signal is behind or ahead of, respectively, said rising edge of said reference clock signal, only when a logic state of said control signal provided by said phase detector is equal to said initial logic state stored in said second oscillator control register, said intermediate control value determining frequency of operation of said digitally-controlled variable oscillator; and d) repeating steps a) through c) until said logic state of said control signal provided by said phase detector is a complement of said initial logic state stored in said second oscillator control register, said controller indicating phase acquisition is complete by restoring said digitally-controlled variable oscillator to said baseline frequency of operation by re-loading said control value from said anchor register into said first oscillator control register.

2. The method of claim 1 further comprising the step of reading a gain value stored in a gain control register before performing the step of detecting, via said phase detector, whether said rising edge of said oscillator output signal is behind or ahead of said rising edge of said reference clock signal, and providing a control signal to said controller, indicative thereof, an initial logic state of said control signal being stored in said second oscillator control register, said gain value determining magnitude of change of said control value, said control value determining magnitude of change of frequency of said digitally-controlled variable oscillator.

3. The method of claim 2 wherein said step of reading a gain value stored in a gain control register comprises updating said gain value by bit-shifting said control value stored in said first oscillator control register by a predetermined number of bits to determine an intermediate gain value, and storing said intermediate value in said gain control register, after each phase acquisition cycle.

4. In a system having a digitally-controlled variable oscillator and a phase detector for comparing a rising edge of a reference clock signal to a rising edge of an oscillator output signal, and a controller including an incrementor and a decrementor coupled to said oscillator and a set of oscillator control registers, a method for performing phase acquisition comprising the steps of:

a) reading a control value stored in a first oscillator control register, said control value initially corresponding to a baseline frequency of operation of said digitally-controlled variable oscillator, and storing said control value initially corresponding to said baseline frequency in an anchor control register, said anchor register functioning to restore said digitally-controlled variable oscillator to said baseline frequency of operation by re-loading said control value into said first oscillator control register upon completion of phase acquisition;

b) reading a gain value stored in a gain control register;

c) detecting, via said phase detector, whether said rising edge of said oscillator output signal is behind or ahead of said rising edge of said reference clock signal, and providing a control signal, to said controller, indicative thereof, an initial logic state of said control signal being stored in said controller;

d) incrementing or decrementing, via said controller, said control value by said gain value to generate an intermediate control value in response to said control signal indicating that said oscillator output signal is behind or ahead of, respectively, said rising edge of said reference clock signal, only when a logic state of said control signal provided by said phase detector is equal to said initial logic state stored in said controller, said intermediate control value determining frequency of operation of said digitally-controlled variable oscillator; and e) repeating steps a) through d) until said logic state of said control signal provided by said phase detector is a complement of said initial logic state stored in said controller, said controller indicating phase acquisition is complete by restoring said digitally-controlled variable oscillator to said baseline frequency of operation by re-loading said control value from said anchor register into said first oscillator control register.

5. The method of claim 4 wherein said step of reading a gain value stored in a gain register comprises updating said gain value by bit-shifting said control value stored in said first control register by a predetermined number of bits to determine an intermediate gain value, and storing said intermediate gain value in said gain control register, after each phase acquisition cycle.

6. The method of claim 4 wherein said controller increments or decrements said control value stored in said controller by said gain value only when a logic state of said control signal provided by said phase detector is equal to an initial logic state stored in said controller.

7. In a phase-locked loop system having a digitally-controlled variable oscillator, a phase detector for providing a control signal indicating whether a rising edge of a reference clock signal is behind or ahead of a rising edge of an oscillator output signal, a controller coupled to said oscillator, and a set of oscillator control registers, a method for performing phase gain adjustment, after said phase-locked loop has completed phase acquisition, while simultaneously maintaining phase-lock in said phase-locked loop system, said method comprising the steps of:

a) storing an initial logic state of said control signal provided by said phase detector in said controller, and initializing a count value in said controller, said count value corresponding to a number of comparison cycles performed by said controller during phase alignment;

b) comparing a current logic state of said control signal provided by said phase detector with a previously stored logic state of said control signal, to determine whether said stored logic state is identical to said current logic state, and incrementing said count value in said controller, only when said stored logic state is identical to said current logic state;

c) updating an oscillator control value stored in a first oscillator control register to adjust said oscillator to maintain phase-lock, in response to said control signal indicating that said oscillator output signal is behind or ahead of, respectively, said rising edge of said reference clock signal;

d) increasing a phase gain value stored in a gain control register by a first predefined amount and resetting said count value, if the count value in said controller exceeds a predefined value, said phase gain value determining a magnitude of change of said control value, said control value determining magnitude of change of frequency of said oscillator;

e) repeating steps b) through d) until a comparison of said previously stored logic state of said control signal is not identical to said current logic state of said control signal provided by said phase detector, indicating said control signal provided by said phase detector has changed state; and f) decreasing the phase gain value by a second predefined amount, to decrease said magnitude of change of said control signal, and resetting said count value.

8. The method of claim 7 wherein steps d) and f) are performed by bit-shifting the phase gain value by a predefined number of bit positions.

9. The method of claim 7 wherein the step b) further comprises the steps of:

detecting, via said phase detector, whether said rising edge of said oscillator output signal is behind or ahead of said rising edge of said reference clock signal, and providing said control signal, to said controller, indicative thereof; and storing said current logic state of said control signal in said controller.

10. The method of claim 7 wherein the step c) comprises the step of incrementing or decrementing, via said controller, said control value by said phase gain value to generate an intermediate control value in response to said control signal indicating that said oscillator output signal is behind or ahead of, respectively, said rising edge of said reference clock signal, only when a logic state of said control signal provided by said phase detector is equal to said previously stored logic state of said control signal, said intermediate control value determining frequency of operation of said oscillator.

11. The method of claim 7 wherein step d) further comprises the step of counting, via said controller, a number of cycles for which the logic state of said control signal provided by said phase detector remains unchanged, and providing said count value indicative thereof, said count value being reset after said count value exceeds said predefined value representing a number of comparison phase detection cycles by which phase alignment between said rising edge of said reference clock signal and said rising edge of said oscillator output signal should have occurred.

12. The method of claim 11 wherein steps b) through f) are repeated by the phase-locked loop system during maintenance of phase lock.

13. In a phase-locked loop system having a digitally-controlled variable oscillator, a phase detector for comparing a rising edge of a reference clock signal to a rising edge of an oscillator output signal, and a controller including an incrementor and a decrementor coupled to said oscillator and a set of oscillator control registers, a method for performing phase gain adjustment, after said phase-locked loop has completed phase acquisition, while simultaneously maintaining phase lock in said phase-locked loop system, said method comprising the steps of:

a) detecting, via said phase detector, whether said rising edge of an oscillator output signal is behind or ahead of said rising edge of said reference clock signal, and providing a control signal, to said controller, indicative thereof;

b) comparing a current logic state of said control signal provided by said phase detector with a previously stored logic state of said control signal, to determine whether said previously stored logic state is identical to said current logic state, and incrementing a count value in said controller, only when said previously stored logic state is identical to said current logic state, said count value corresponding to a number of comparison cycles performed by said controller during phase alignment;

c) updating a binarily-weighted oscillator control value stored in a third register to adjust said oscillator to maintain phase-lock, in response to said control signal indicating that said oscillator output signal is behind or ahead of, respectively, said rising edge of said reference clock signal;

d) increasing a phase gain value by a first predefined amount and resetting said count value to zero, only if the count value in said controller exceeds a predefined value, said phase gain value determining a magnitude of change of said control value, said control value determining magnitude of change of frequency of said oscillator; and e) repeating steps a) through d) until a comparison indicates said previously stored logic state of said control signal is not identical to said current logic state of said control signal provided by said phase detector; and f) decreasing the phase gain value by a second predefined amount and resetting said count value to zero.

14. The method of claim 13 wherein steps a) through f) are repeated by the phase-locked loop system during maintenance of phase lock.

15. The method of claim 13 wherein steps d) and f) are performed by bit-shifting the phase gain value by a predefined number of bit positions.

16. A system for performing phase acquisition comprising: a digitally-controlled variable oscillator;

control registers, coupled to said oscillator, for storing in a first control register an initial control value corresponding to a target frequency of said oscillator, and for storing in a second register a gain value;

phase detector circuitry, coupled to said oscillator, for detecting whether a rising edge of an oscillator output signal is behind or ahead of a rising edge of a reference clock signal, and for providing at least one control signal indicative thereof, an initial logic state of said at least one control signal being stored in a third control register; and controller circuitry, coupled to said phase detector circuitry and said control registers, for storing said initial control value stored in said first control register into a fourth control register, said controller circuitry incrementing or decrementing said control value stored in said first control register by said gain value to generate an intermediate control value in response to said phase detector circuitry indicating that said oscillator output signal is behind or ahead of, respectively, said rising edge of said reference clock signal, said intermediate control value determining frequency of operation of said digitally-controlled variable oscillator, said controller circuitry determining that phase acquisition is complete when said logic state of said control signal provided by said phase detector circuitry is a complement of said initial logic state stored in said third control register, said controller circuitry then restoring said digitally-controlled variable oscillator to said baseline frequency of operation by re-loading said initial control value from said fourth control register into said first control register.

17. The system of claim 16 wherein said controller increments or decrements said control value stored in said fourth register by said gain value only when a logic state of said control signal provided by said phase detector is equal to said initial logic state stored in said third control register.

18. In a system having a variable oscillator coupled to a plurality of oscillator control registers, means for performing phase acquisition comprising:

phase detector circuitry, coupled to said oscillator, for detecting whether a rising edge of an oscillator output signal is behind or ahead of a rising edge of a reference clock signal, and for providing at least one control signal indicative thereof, an initial logic state of said at least one control signal being stored in a first control register; and controller circuitry, coupled to said phase detector circuitry and said control registers, for storing an initial control value corresponding to a target frequency of said oscillator from a second control register to a third control register, said controller circuitry incrementing or decrementing said initial control value stored in said second control register by a gain value stored in a fourth register to generate an intermediate control value, in response to said phase detector circuitry indicating that said oscillator output signal is behind or ahead of, respectively, said rising edge of said reference clock signal, said intermediate control value determining frequency of operation of said oscillator, said controller circuitry determining that phase acquisition is complete when said logic state of said control signal provided by said phase detector circuitry is a complement of said initial logic state stored in said first control register, said controller circuitry then restoring said oscillator to said target frequency of operation by re-loading said initial control value from said third control register into said second control register.

19. The system of claim 18 wherein said controller circuitry increments or decrements said control value stored in said second control register by said gain value only when a logic state of said control signal provided by said phase detector is equal to said initial logic state stored in said first control register.

20. In a system having a variable oscillator coupled to a plurality of oscillator control registers, means for performing phase acquisition comprising:

phase detector circuitry, coupled to said oscillator, for detecting whether a rising edge of an oscillator output signal is behind or ahead of a rising edge of a reference clock signal, and for providing at least one control signal indicative thereof, an initial logic state of said at least one control signal being stored in a first control register; and controller circuitry, coupled to said phase detector circuitry and said control registers, for storing an initial control value corresponding to a target frequency of said oscillator from a second control register to a third control register, said controller circuitry incrementing or decrementing said initial control value stored in said second control register by a variable gain value stored in a fourth control register to generate an intermediate control value, in response to said phase detector circuitry indicating that said oscillator output signal is behind or ahead of, respectively, said rising edge of said reference clock signal, said controller circuitry determining that phase acquisition is complete when said logic state of said control signal provided by said phase detector circuitry is a complement of said initial logic state stored in said first control register, said controller circuitry then restoring said oscillator to said target frequency of. operation by re-loading said initial control value from said third control register into said second control register.

21. The system of claim 20 wherein said controller circuitry increments or decrements said initial control value stored in said second control register by said variable gain value only when a logic state of said control signal provided by said phase detector is equal to said initial logic state stored in said first control register.

22. The system of claim 20 wherein said controller circuitry increases said variable gain value by monitoring a consecutive number of corrections made to said initial control value, stored in said second control register, in one direction, and bit-shifting in a first direction a current phase gain value stored in said fourth control register by a variable number of bit positions after said consecutive number of corrections exceeds a predefined number, to generate said variable gain value.

23. The system of claim 20 wherein said controller circuitry decreases said variable gain value stored in said fourth control register by bit-shifting in a second direction a current phase gain value by a variable number of bit positions when said control signal provided by said phase detector indicates a change in polarity of phase error.

* * * * *